(12) United States Patent
Petrovic (10) Patent No.: US 8,275,817 B2
(45) Date of Patent: Sep. 25, 2012

(54) BROADBAND LOW NOISE COMPLEX FREQUENCY MULTIPLIERS

(75) Inventor: Branislav A. Petrovic, La Jolla, CA (US)

(73) Assignee: General Instrument Corporation, Horsham, PA (US)

( * ) Notice: Subject to any disclaimer, the term of this patent is extended or adjusted under 35 U.S.C. 154(b) by 1226 days.

(21) Appl. No.: 11/737,384

(22) Filed: Apr. 19, 2007

(65) Prior Publication Data
US 2008/0258783 A1 Oct. 23, 2008

(51) Int. Cl.
G06F 7/00 (2006.01)
(52) U.S. Cl. ..................................................... 708/200
(58) Field of Classification Search .................. None
See application file for complete search history.

(56) References Cited

U.S. PATENT DOCUMENTS

| | | | |
|---|---|---|---|
| 5,389,886 A * | 2/1995 | Popescu ........................ | 327/120 |
| 6,404,293 B1 | 6/2002 | Darabi et al. | |
| 6,456,143 B2 | 9/2002 | Masumoto et al. | |
| 6,466,064 B2 * | 10/2002 | Kurogouchi et al. ......... | 327/113 |
| 6,728,527 B2 | 4/2004 | Casagrande | |
| 7,495,484 B1 * | 2/2009 | Petrovic ........................ | 327/119 |
| 2001/0043109 A1 | 11/2001 | Masumoto et al. | |
| 2002/0156820 A1 * | 10/2002 | Kishi ............................. | 708/300 |
| 2005/0123025 A1 * | 6/2005 | Sorrells et al. ................ | 375/130 |
| 2009/0033378 A1 * | 2/2009 | Petrovic ........................ | 327/121 |
| 2009/0061810 A1 * | 3/2009 | Petrovic et al. ............... | 455/323 |

OTHER PUBLICATIONS

PCT International Search Report for PCT/US08/60412—dated Aug. 15, 2008.
"A 5-GHz Frequency-Doubling Quadrature Modulator with a Ring-Type Local Oscillator" by Hiroto Matsuoka and Tsuneo Tsukahara. IEEE Journal of Solid-State Circuits, vol. 34, No. 9, Sep. 1999.

* cited by examiner

Primary Examiner — David H Malzahn
(74) Attorney, Agent, or Firm — Susan R. Payne (57) ABSTRACT

A frequency multiplier device including a plurality of multipliers, each of which has a first input port, a second input port and an output port; a first combiner coupled to the plurality of multipliers so as to receive an output signal from at least two of the plurality of multipliers, the first combiner outputting a first output signal; and a second combiner coupled to the plurality of multipliers so as to receive an output signal from at least two of the plurality of multipliers, the second combiner outputting a second output signal. The plurality of multipliers includes a first multiplier, a second multiplier, a third multiplier and a fourth multiplier, where the first multiplier has a first input port and a second input port and receives a first input signal at the first input port and the second input port; the second multiplier has a first input port and a second input port and receives a second input signal at the first input port and the second input port; the third multiplier has a first input port and a second input port and receives the second input signal at the first input port and the first input signal at the second input port; and the fourth multiplier has a first input port and a second input port and receives the first input signal at the first input port and the second input signal at the second input port.

18 Claims, 5 Drawing Sheets

BROADBAND LOW NOISE COMPLEX FREQUENCY MULTIPLIERS

BACKGROUND OF THE INVENTION

1. Field of the Invention

This invention relates to a method and apparatus for performing frequency multiplication which exhibits low phase noise and low broadband noise, and which is based on a complex frequency multiplier (CFM) method utilizing complex frequency shifters (CFS), which can be implemented, for example, by double-quadrature multipliers.

2. Background of the Related Art

Frequency multipliers along with frequency dividers are among the very essential building blocks in frequency generation and synthesis devices and are extensively used in these and many other applications. Signal sources with very low phase noise are increasingly more in demand as the frequencies utilized by such devices continue to increase along with the overall performance requirements. For example, the jitter of the clock caused by phase noise limits the achievable signal-to-noise ratio "SNR" in high speed ADCs/DACs. Reducing the clock jitter improves the achievable performance and allows higher frequency operation in demanding applications. This is one example among many where a low noise frequency multiplier allows for improved operating performance.

Numerous types of frequency multipliers are known in the art (e.g., frequency doublers), and include both analog and digital based devices. Generally speaking, analog multipliers have some advantages over digital multipliers in that they can operate at higher frequencies, achieve higher multiplication ratios, have lower phase noise and lower broadband noise, and consume less power. Analog multipliers can typically be divided in two categories: direct analog multipliers and the multipliers based on multiplying phase-lock loops or other schemes employing closed loop feedback systems or injection-locking mechanisms. As explained in detail below, the present invention falls within the category of direct analog multipliers.

Direct analog multipliers can further be divided into multipliers based on parametric nonlinearities of components, for instance nonlinear conductance or capacitive reactance and those using multiplying devices, such as mixers. Discrete circuits using nonlinearities of components such as diodes or transistors have been extensively used in the prior art, but typically need to be tuned to a specific frequency range or spectral component and are narrow-band. Mixer-based multipliers are a more systematic way of performing frequency multiplication, and provide wider bandwidth capabilities and have potential for larger multiplication ratios.

Figure 1:
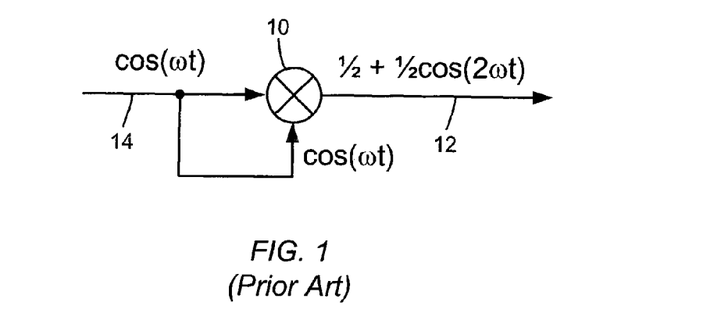
FIG. 1 is a block diagram of a first prior art frequency multiplication circuit.

A typical mixer-based frequency doubler circuit of the prior art is shown in the block diagram of FIG. 1. Referring to FIG. 1, the device includes a mixer 10 which serves as a multiplier of the input signal $\cos \omega t$ present at input 14 with itself and thereby up-converts the frequency to a double frequency $\cos 2\omega t$ at the output 12. The amplitude of the up-converted signal is $\frac{1}{2}$ of the input amplitude representing a 6 dB loss. The multiplication in mixer 10 is a double sideband conversion (DSB), meaning the multiplication also generates another sideband, a DC component in this case (term $\frac{1}{2}$ at the output 12). This term is not desired because it burdens the mixer's 10 dynamic range resulting in reduced converted signal level and consequently reduced signal to noise ratio (SNR). When compared with a single sideband conversion (SSB), the DSB conversion will exhibit a 3 dB lower SNR because only one of the two converted sidebands is used while the other one is wasted, i.e. half of the converted power is lost, resulting in a 3 dB SNR reduction. This loss of SNR adds to other circuit implementation losses and of course can not be recovered by any amount of post-mixer gain.

Figure 2:
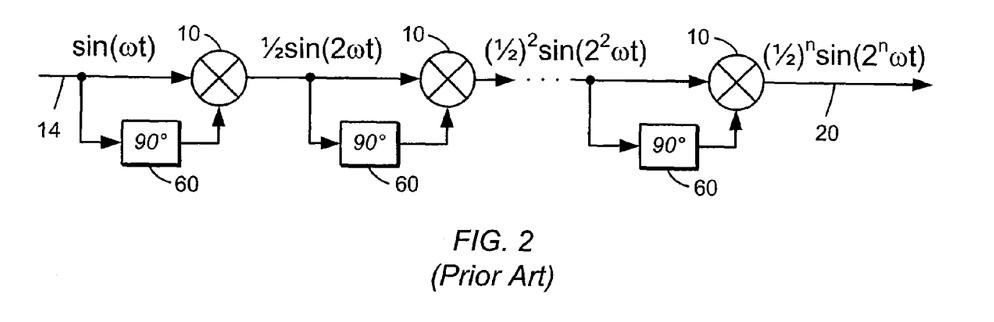
FIG. 2 is a block diagram of a second prior art frequency multiplication circuit.

Another prior art multiplier circuit is illustrated in the block diagram of FIG. 2. As shown in FIG. 2, the device includes a cascade of doublers each of which contains a mixer 10. As a result, the device achieves a frequency multiplication by a factor of $2^n$, where n represents the number of frequency doublers (i.e., mixers). In each stage, mixer 10 is driven with signals in phase quadrature, as one of the signals coupled to the mixer is output by a quadrature splitting circuit 60. Multiplying the quadrature signals results in a product with no DC content at the output thereby improving the dynamic range. One drawback of the cascaded device of FIG. 2 is that the quadrature splitting circuit 60 needs to be repeated in every stage, adding to the complexity and reducing the bandwidth (BW) of the system. The BW is reduced because the quadrature splitting circuits 60 are effectively connected in series with each other, resulting in a reduction of the aggregate BW compared with a BW of a single quadrature splitter. Since the frequency is different (i.e., doubled) at every stage, the quadrature splitter 60 at each stage is different from the other stages, and needs to be designed and tuned to a different frequency thus complicating the design and manufacturing of the device. Another drawback of this circuit is the loss of SNR due to DSB conversion, which increases the SNR degradation from stage to stage by 3 dB, as compared with SSB conversion.

While devices for performing frequency multiplication by smaller factors (for instance 2 or 4) have been addressed extensively in the prior art, that is not the case for frequency multiplication by a larger number or factor. Generally speaking, devices for performing frequency multiplication by a factor greater than 4 have not been addressed in the prior art. Thus, there remains a need for a frequency multiplication device which provides for multiplication by higher factors (as well as low factors), which exhibits improved SNR and addresses the other limitations noted above.

SUMMARY OF THE INVENTION

It is one objective of the present invention to provide a frequency multiplier method and apparatus which exhibits very low phase noise and very low broadband noise, and which is suitable for use as a reference signal in frequency synthesizers or as LO sources, or to generate low jitter clocks for DACs/ADCs.

It is another objective of the present invention to provide a frequency multiplier method and apparatus which achieves very wide frequency range of operation from low frequencies near DC to very high frequencies close to the transition frequency $f_t$ of the active devices utilized.

It is yet another objective of the present invention to provide a frequency multiplier method and apparatus which simplifies cascading of multiple stages by directly interconnecting the cascaded stages without the need for additional circuitry to achieve higher multiplication ratios.

Another objective of the present invention is to provide the output quadrature components I and Q of the multiplied signal for use as a source of quadrature signals to be utilized by other components in the system.

Yet another objective of the present invention is to provide a frequency multiplier method and apparatus which provides for fast acquisition of the input signal and provides the in-phase and quadrature components of the output multiplied signal with minimal delay, using little or no filtering thus not slowing down the acquisition and multiplication process.

It is further an objective of the present invention to provide a frequency multiplier method and apparatus which achieves low radiated and conducted EMI emissions in order to reduce unwanted signal coupling or ingress into other circuits in densely populated designs, such as in monolithic ICs.

It is yet another objective of the present invention to achieve the above objectives in a manner enabling a simple design and implementation in integrated circuits (ICs) without using external components such as bulky coils and capacitors and without a need for any adjustments, tweaking or calibration during production.

Accordingly, the present invention relates to a frequency multiplier device including a plurality of multipliers, each of which has a first input port, a second input port and an output port; a first combiner coupled to the plurality of multipliers so as to receive an output signal from at least two of the plurality of multipliers, the first combiner outputting a first output signal; and a second combiner coupled to the plurality of multipliers so as to receive an output signal from at least two of the plurality of multipliers, the second combiner outputting a second output signal. The plurality of multipliers includes a first multiplier, a second multiplier, a third multiplier and a fourth multiplier, where the first multiplier has a first input port and a second input port and receives a first input signal at the first input port and the second input port; the second multiplier has a first input port and a second input port and receives a second input signal at the first input port and the second input port; the third multiplier has a first input port and a second input port and receives the second input signal at the first input port and the first input signal at the second input port; and the fourth multiplier has a first input port and a second input port and receives the first input signal at the first input port and the second input signal at the second input port.

Among other advantages, as noted below the frequency multiplier device of the present invention provides a low noise device suitable for IC integration and capable of covering extremely wide frequency range from near DC to near maximum frequency of operation of active devices (e.g. close to a transition frequency $f_T$ of IC processes) in the multi-GHz range, thus offering significant performance advantages in frequency synthesis as a reference signal, stand-alone LO signal source or a low jitter clock for ADCs or DACs in many applications ranging from high speed digital communications in CATV to wireless communications and other modern consumer and commercial electronics devices.

Additional advantages of the present invention will become apparent to those skilled in the art from the following detailed description of exemplary embodiments of the present invention.

The invention itself together with further objects and advantages, can be better understood by reference to the following detailed description and the accompanying drawings.

BRIEF DESCRIPTION OF THE DRAWINGS

FIG. 3b is a simplified block diagram of the CFM multiplier illustrated in FIG. 3a.

DETAILED DESCRIPTION OF THE INVENTION

Figure 3A:
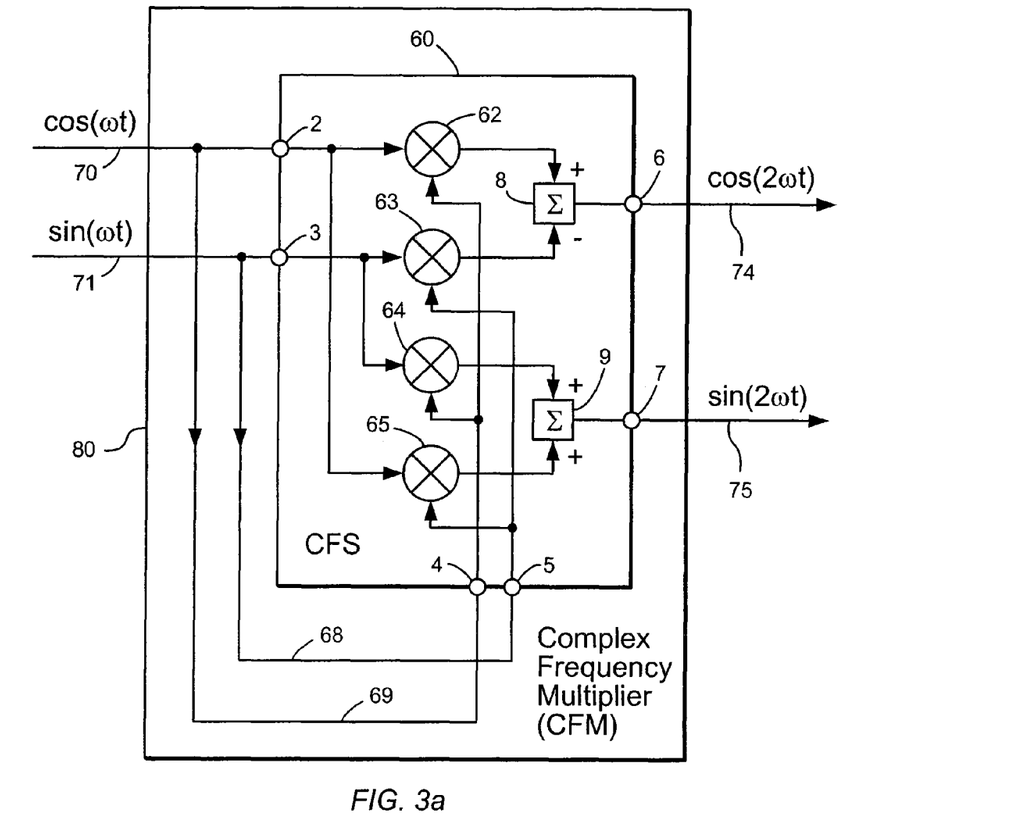
FIG. 3a is an exemplary block diagram of a first embodiment of a complex frequency multiplier "CFM" in accordance with the present invention.

FIG. 3a is an exemplary block diagram of the complex frequency multiplier (CFM) 80 of the present invention. In general, the CFM circuit 80 provides a multiply-by-2 function or frequency doubling, which is achieved by connecting a complex frequency shifter (CFS) 60 in a feed-forward arrangement, connecting an input signal to one input pair of the CFS circuit 60 and forwarding this same signal to the other input pair. When a complex signal having the in-phase component cos ωt and the quadrature component sin ωt is applied to the input ports, the CFM circuit 80 performs frequency multiplication by 2 and provides at the output ports the multiplied signal at twice the input frequency. In the given embodiment, the multiplied output signal is also complex, having two components in phase quadrature.

More specifically, the complex frequency multiplier (CFM) circuit 80 includes a complex frequency shifter (CFS) 60 based on a double-quadrature multiplier scheme using four individual multipliers 62, 63, 64 and 65, wherein multipliers 62 and 65 receive a first input signal 70 to the CFM 80 as a first input signal, and multipliers 63 and 64 receive a second input signal 71 to the CFM 80 as a first input signal. Further, multipliers 62 and 64 receive the first input signal 70 as a second input signal, and multipliers 63 and 65 receive the second input signal 71 as a second input signal. The outputs of multipliers 62 and 63 are coupled to a first combiner circuit 8 and the outputs of multipliers 64 and 65 are coupled to a second combiner circuit 9. The outputs of summers 8 and 9 represent the output of the CFM 80. It is noted that other circuit configurations can also be utilized to implement the functionality of the CFM 80.

Turning to the operation, the CFS 60 is configured so as to perform a complex up-conversion to the upper sideband "USB". In other words, to produce the sum of the two input frequencies, which is determined by the polarity choice of the signal combiners or summing/subtracting circuits 8 and 9. For the desired up-conversion, the combiner 8 provides the difference signal, while the combiner 9 provides the sum signal as shown in FIG. 3a. As noted, the CFS 60 has two complex inputs (i.e., inputs (2 and 3) and (4 and 5)) and one complex output (outputs 6 and 7). Each complex input consists of a pair of ports: the in-phase I port and the quadrature Q port. The complex output port also consists of an I port (6) and a Q port (7). The first complex input is at ports 2 and 3, where port 2 is the I input port and port 3 is Q input port. The second complex input is at ports 4 and 5, port 4 being the I input port and port 5 the Q input port. The complex output consists of port 6, the I output, and of port 7, the Q output.

The frequency multiplication by the CFM 80 is realized by connecting the input ports 2 and 3 of the CFS 60 to the other pair of input ports 4 and 5 via the connections 68 and 69, respectively, as shown in FIG. 3*a*. While shown here as direct interconnects, the connections 68 and 69 in general may include a network or a circuit, and/or even active amplifiers to facilitate desired aspects of performance and optimize the overall circuit operation.

It is noted that the CFM 80 of the given embodiment utilizes two input signals in quadrature to operate. These signals are provided from an external source to the circuit. When a complex signal having the in-phase component cos ωt and the quadrature component sin ωt is applied to the input ports of the CFM 80 circuit of FIG. 3*a*, the circuit CFM 80 performs frequency doubling and at the output ports provides the signal at twice the input frequency. The multiplied output signal is also complex and has two components: the in-phase multiplied signal cos ωt at port 6 and the quadrature multiplied signal sin 2 ωt at port 7.

Specifically, with the input signal expressed in the phasor form using Euler's formula:

$$e^{j\omega t}=\cos \omega t+j \sin \omega t \text{ at complex port (2,3)}, \quad (1)$$

the multiply-by-2 signal at the output of the CFM circuit 80 can also be expressed in a complex form:

$$e^{j2\omega t}=\cos (2\omega t)+j \sin (2\omega t) \text{ at complex port (6,7)} \quad (2)$$

Equations (1) and (2) express the canonical operation of the CFM circuit 80, which takes the input complex signal $e^{j\omega t}$, operates on its argument and delivers the multiply-by-2 complex signal $e^{j2\omega t}$ at the output. The magnitude of the output signal is unity, equal to that of the input, representing a property of unity gain of the CFM circuit 80. The real and imaginary components of the output complex signal in Eq. (2), representing the in-phase I and the quadrature Q components of the multiplied output, are in quadrature. The phases of the output components with respect to each other and with respect to the input signal are defined per Eq. (1) and (2): the output signal at port 6 providing the output's real component cos 2 ωt is in-phase (0°) with respect to the input in-phase component cos ωt; and the signal at output port 7 sin 2 ωt lags behind the in-phase signal at port 6 by 90°. In the actual circuit, a small phase delay of the output signal with respect to the input signal will occur due to the propagation delay time τ through the circuit. The phase delay will equal to 2 ωt in both the I and Q output arms relative to their respective inputs.

The provision of the quadrature components at the output of the CFM circuit 80 represents a powerful feature of the present invention. More specifically, the availability of the I and Q quadrature components of the multiplied signal may be utilized as a quadrature source for other elements contained within the system. For example, the quadrature signal output by the CFM circuit 80 can be used to drive an I, Q modulator stage in a transmitter application, or an I, Q demodulator in a receiver application as a quadrature local oscillator (LO), replacing the often utilized poly-phase filters commonly used to derive quadrature components.

Figure 3B:
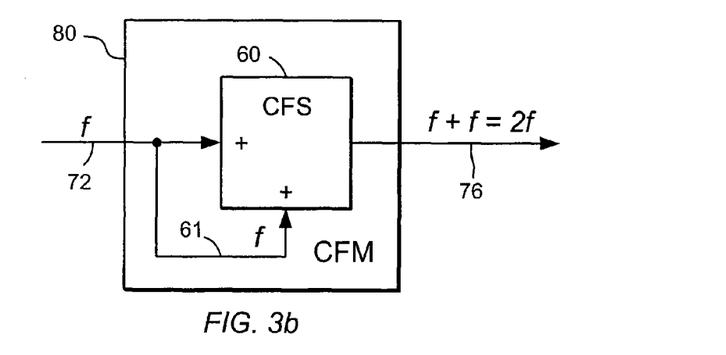
Figure 4:
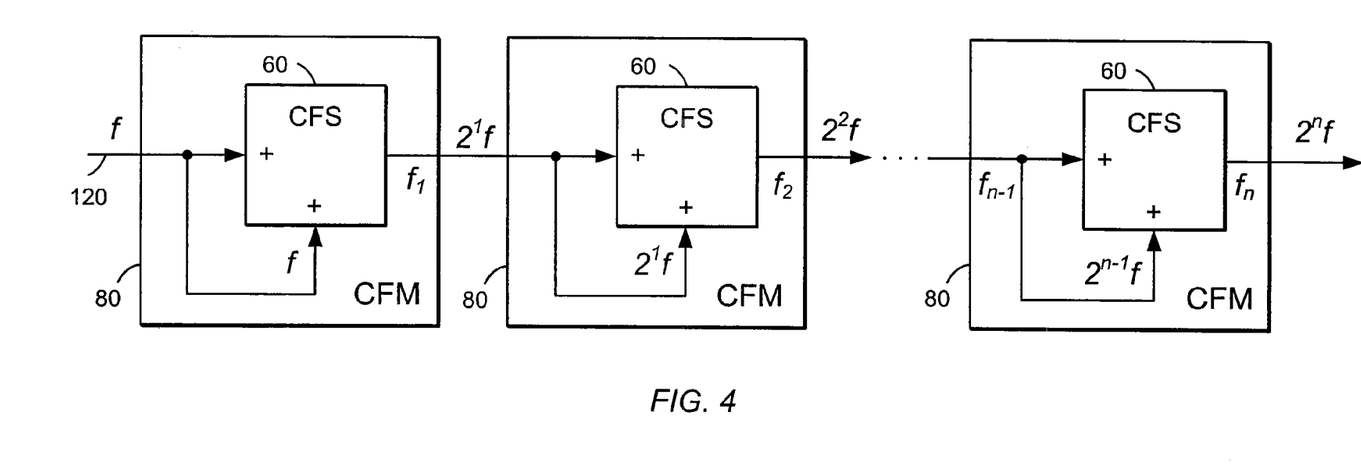
FIG. 4 is an exemplary block diagram of a second embodiment of the present invention, in which the CFM circuits are connected in a cascaded configuration.

The quadrature signal can also be utilized in conjunction with the direct cascading of multiple CFM 80 stages, for example as shown in FIG. 4, which is an example of a second embodiment of the present invention, to obtain higher multiplication ratios. Such a cascaded configuration can be utilized, for example, in a synthesizer application as an LO signal. Unlike the prior art devices, the quadrature phase relationship is preserved in the cascaded CFM configuration from stage to stage, i.e. the quadrature relationship "propagates" through the system and need not be recreated again anywhere within the chain. Thus, the cascading can be easily accomplished by simply connecting the output ports of one stage to the corresponding input ports of the next stage. More specifically, the cascading configuration is obtained by connecting the complex output port (6, 7) of a first CFM 60 to the input complex port (2, 3) of the next stage (i.e., a second CFM 80) and so on. As shown in FIG. 4, the output frequency doubles at the output of each successive CFM 80. It is noted that the cascading configuration shown in FIG. 4 utilizes the simplified block diagram of the present invention CFM 80 as shown in FIG. 3*b*.

Considering a case with ideal operation (i.e., a pure multiplied sinusoidal signal per Eq. (2)), there would be no unwanted images or sidebands at the output and no additional filtering would be required, the principal advantage of the complex multiplication compared with a single-dimensional operation. Of course, a pure sine-wave per Eq. (2) implying a perfect linearity, signal balance and isolation generally cannot currently be realized. In the practical circuit design harmonic distortion will typically occur due to nonlinearity in multipliers 62-65. The level of distortion typically depends on the nonlinearity in conjunction with the applied signal levels. In general, the level of higher frequency harmonic energy with the present invention circuit will be far below the desired signal, easily a few orders of magnitude lower. In addition to providing a spectrally cleaner signal, low harmonic content with the present invention circuit will result in low radiated and conducted EMI emissions advantageous in reducing or eliminating unwanted signal coupling or ingress into other circuits in densely populated designs, such as in monolithic ICs.

It is further noted that due to other circuit imperfections such as imbalances of amplitude and phase in the I and Q arms, there may be other unwanted terms, such as images, input signal leakages, etc., present at the output signal. The quality of the output signal will also depend on the phase and amplitude balance of the input quadrature signals provided externally to the circuit. In a typical IC circuit, the image suppression and the input signal leakage terms will be on the order of 35 dBc to 40 dBc below the desired signal. Depending on the system requirements and the application, some filtering of these terms may be necessary.

As noted above, FIG. 3*b* is a simplified representation of the CFM multiplier circuit of the present invention of FIG. 3*a*, depicting the basic multiplication property of the CFM circuit 80 in a simplified manner. Referring to FIG. 3*b*, the mixer and summer circuits of the CFM circuit are represented as a complex frequency shifter "CFS" circuit 60. In addition, complex input and output ports, consisting of two ports each in FIG. 3*a*, are represented with a single line for the purpose of simplification in the diagram of FIG. 3*b*. It should be noted that each of the lines 72, 61 and 76 represents a complex single line, consisting of two different signal lines, the in-phase or cosine and the quadrature or sine signal line, each connected to the corresponding I, Q port pair of the complex frequency shifter circuit 60 of FIG. 3*a*. The plus signs inside the box 60 indicate that the frequencies at the corresponding ports are added at the output. As shown, the input frequency f at the input 72 is doubled to 2 f at the output 76.

As already noted, FIG. 4 shows a diagram of the multipliers CFM 80 connected in a cascading configuration when a higher frequency multiplication ratio is desired. The diagram illustrates a chain of n CFM circuits 80 of FIG. 3*b*, the output of one driving the input of the next, achieving a total multiplication ratio of $2^n$. In-between stages, all binary multiplications are also available to be tapped, starting from 2 at the output of the first stage through to $2^n$ at the output of the last stage. All interconnect lines in FIG. 4 carry complex signals, i.e. each line carries two signals, I and Q.

The property of unity gain from input to output of the inventive CFM circuit 80 is important and useful in the case of interconnecting multiple circuits in a cascaded configuration such as shown in FIG. 4. The unity gain will maintain uniform signal levels throughout the cascaded chain, thereby eliminating the need for any amplification or attenuation thereof. For example, the CFM circuit 80 with an input signal of 0.6 V peak to peak or 0 dBm will produce a frequency multiplied output signal of 0 dBm, thereby enabling an easy interface to the next stage of the same or similar kind.

The acquisition of the multiplication signal and subsequent delivery of the multiplied signals at the output of both the in-phase and quadrature components is very fast, on the order of the propagation delay time τ through the circuit. With high frequency IC processes, the time delay τ can be extremely small. For example, with $f_T$ of 25 GHz, the delay τ is on the order of a few tens of picoseconds. The fast response of the CFM circuit 80 is possible because there are no other delay mechanisms (such as filter delays or similar) in the circuit besides the core delay τ to slow the signal down, as is the case with some prior art solutions. Thus, the quadrature components I and Q of the multiplied signal of CFM circuit 80 will be generated and provided at the output very fast, substantially instantaneously upon application of the input signal (to the extent of the speed of generation and availability of the quadrature signals at the input) incurring only minimum delay equal to the propagation delay τ. This is a valuable feature for applications requiring very fast frequency hopping, such as in spread-spectrum systems and other fast signal switching applications.

Another advantage associated with the present invention is that very low phase-noise and broadband noise are achievable with the CFM circuit 80. The output noise in the CFM circuit 80 is a function of the following factors: the noise figures of the input ports, the magnitude of the signal levels applied to these ports and the effects of the multiplication process. The CFM circuit's close-in phase-noise is governed by the close-in flicker noise of the mixers, while the broadband noise of the CFM circuit is governed by the noise figure of the mixers. Particularly suitable mixers providing low noise and high signal level capability for use in the present invention include, but are not limited to, analog or RF types such as single or double-balanced mixers with diodes or active-switches, and Gilbert-cell based mixers. It is noted that very low noise figures and flicker noise levels are achievable with mixers, including the ones integrated in ICs implementation, with low noise figures resulting in noise floors not far from the thermal noise of −174 dBm/Hz and very low flicker noise corners below 1 kHz, providing extremely low close-in phase noise. By using mixers with higher compression points capable of handling high signal levels and increasing the signal drive levels it is possible with the CFM circuit 80 to achieve a very high output SNR in excess of 170 dBc/Hz.

As is known, frequency multiplication increases the noise. For example, frequency doubling increases the phase noise voltage by a factor of 2 (this is because doubling of the frequency also doubles the index of phase modulation caused by noise, thus doubling the noise voltage) which translates to 4 times or 6 dB of the phase noise power increase. The phase noise in general represents only half of the broadband noise power and the other half is the amplitude noise. Due to a signal limiting that may occur in the present invention frequency multiplier, some of the amplitude noise may be converted to phase noise, making the phase noise dominant. When multiple CFM circuits 80 are connected in a cascaded configuration as shown for example in FIG. 4 for higher multiplication ratios, the output noise is dominated by the noise power of the first stage in the cascade which gets multiplied by the square of the cascade's frequency multiplication ratio.

Figure 5:
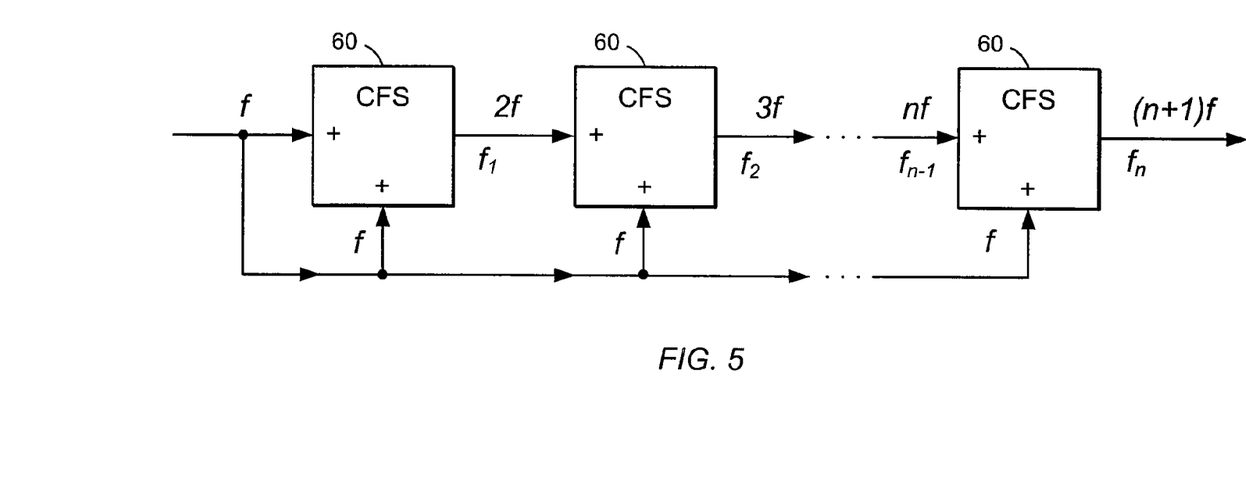
FIG. 5 is an exemplary block diagram of a third embodiment of the present invention, in which the multipliers are connected in a cascaded configuration so as to provide multiplication by an integer.

In another embodiment of the present invention, multiplication by an integer rather than by a binary power of 2 as with the circuit of FIG. 4 can be accomplished, for example, by the cascaded configuration of the CFM circuits 80 as shown in FIG. 5. The capability to multiply by an integer is achieved in configuration of FIG. 5 by feeding forward the same input signal of frequency f to the inputs of all CFS 60 stages in the cascade chain. FIG. 5 shows a chain of n multiplier circuits, the output of one stage driving one input of the next stage, while the other input of all stages is driven by the input signal in a feed-forward arrangement. With n stages, a multiplication by an integer with a total multiplication factor of (n+1) is achieved. All lower integer multiplicands are available to tap in-between the stages, starting from 2 at the output of the first stage, 3 at the next and so on up to the integer (n+1) at the output of the last, $n^{th}$ stage.

Figure 6:
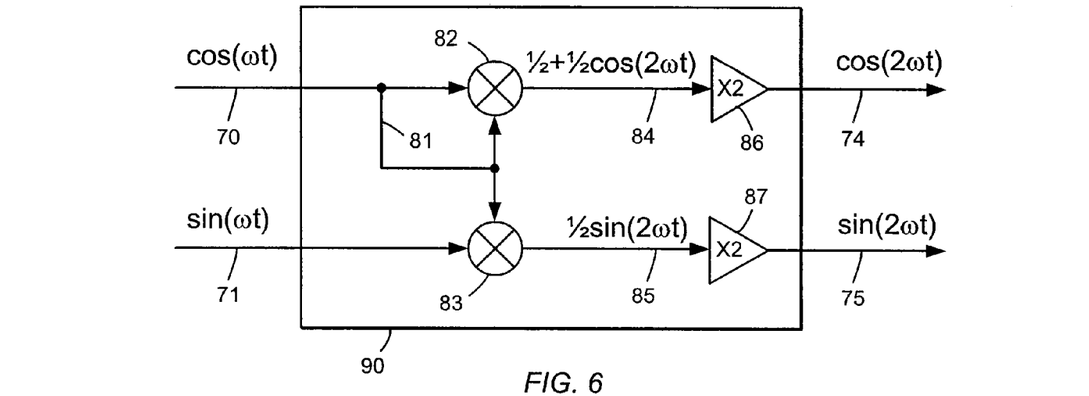
FIG. 6 is an exemplary block diagram of a fourth embodiment of the present invention, in which the multiplier includes a frequency doubler circuit having reduced complexity.

FIG. 6 illustrates another embodiment of the present invention, specifically, a reduced complexity frequency doubler circuit 90. The embodiment of FIG. 6 eliminates a pair of mixers compared with the CFM circuit 80, but has a 3 dB lower SNR because of a DSB conversion. The in-phase input signal cos ωt at the input port 70 serves as the local oscillator (LO) to both mixers via connection 81. This signal is multiplied by itself in the mixer 82 producing a double-frequency in-phase signal cos 2 ωt at the output port 74. The quadrature input signal sin ωt from port 71 is multiplied with the cos ωt signal from port 70 in the mixer 83 producing a double-frequency quadrature signal sin 2 ωt at the output port 75. The connection 81 can be relocated from port 70 to port 71 so that the sin ωt signal becomes the LO to both mixers instead of the cos ωt. In such a configuration, the circuit 90 of FIG. 6 still functions as a frequency doubler, however, the in-phase and quadrature signals at ports 74 and 75 will be swapped and the signal at 75 will have an inverted polarity. Amplifier stages 86 and 87 are optional and are shown with the amplification factor or gain of 2 in order to attain the unity gain of the doubler circuit 90. Amplifier 86 also blocks or offsets to zero the DC product term at 84, thereby preventing it from propagating and burdening the dynamic range of the system. In a variation of the foregoing, the function of the amplifiers 86 and 87 can be incorporated within mixers 82 and 83. The unity gain facilitates direct cascading for higher multiplication ratios of the circuit 90 without intermediate stages as is shown in FIG. 7.

Figure 7:
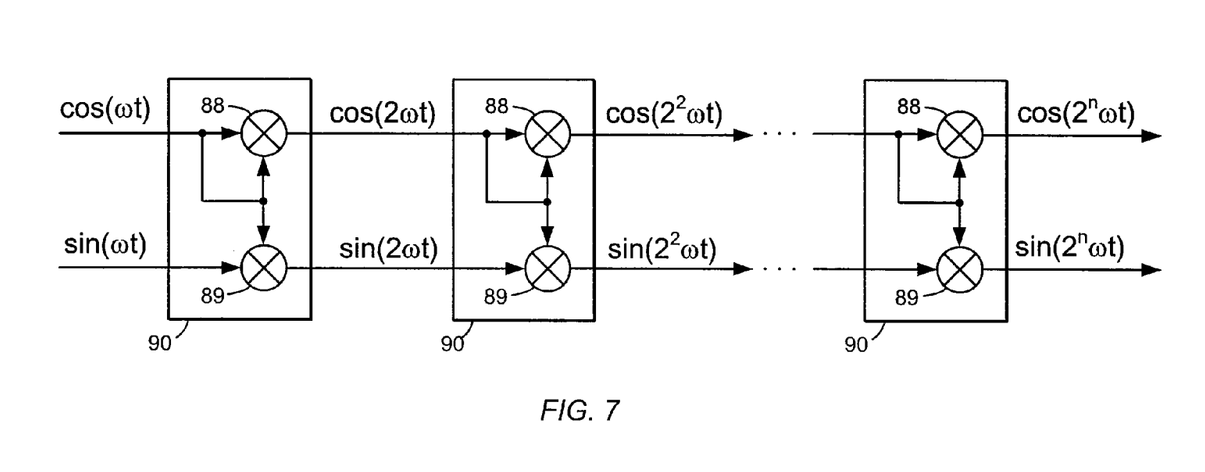
FIG. 7 is an exemplary block diagram of a fifth embodiment of the present invention, in which the multiplier of FIG. 6 is coupled in a cascaded configuration.

FIG. 7 is a block diagram illustrating the use of the frequency doubler circuit 90 of FIG. 6, utilized in a cascaded configuration. As noted, and as shown in FIG. 7, the amplifiers 86 and 87 of FIG. 6 are absorbed within mixers 88 and 89 to achieve a unity gain of the circuit 90 in FIG. 7. The unity gain simplifies direct interconnects between adjacent stages in the cascaded configuration and maintains uniform signal levels throughout the cascade without any intermediate stages. Referring to FIG. 7, the configuration includes a chain of n multiplier circuits 90, the output of one driving the input of the next, achieving a total multiplication factor of $2^n$. All lower multiplicands with binary power of 2 are available to tap in-between the stages, starting from 2 at the output of the first stage through to $2^n$ at the output of the last, $n^{th}$ stage.

Figure 8:
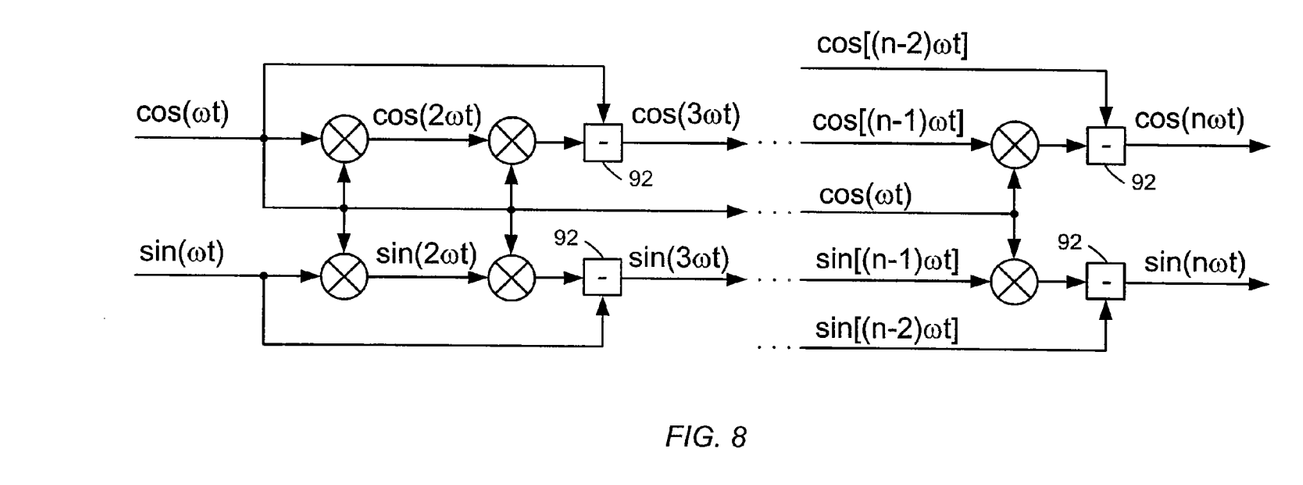
FIG. 8 is an exemplary block diagram of a sixth embodiment of the present invention, in which the multipliers of FIG. 6 are connected in a cascaded configuration so as to provide multiplication by an integer.

FIG. 8 is yet another embodiment utilizing the frequency multiplier circuit 90 of FIG. 6, in which the circuits 90 are connected in a cascaded configuration so as to provide a multiplication by an integer number. This is a simplified circuit compared with the integer multiplier circuit of FIG. 5, in that the circuit of FIG. 8 eliminates a pair of mixers in each stage. The capability to multiply by an integer number is achieved in FIG. 8 by feeding forward the same input signal to the inputs of all mixer stages in the cascade. The exemplary block diagram shows a chain of (n−1) multiplier circuits 90, the output of one driving one input of the next, while the other input of all stages is driven by the input signal in a feed-forward arrangement. The output of each mixer stage contains both the sum and the difference frequency of the multiplied signals. The sum frequency is desired while the difference is undesired. As such, a key step, which is necessary to eliminate the undesired frequency term so as to provide a clean spectrum at each stage and enable the cascading, is recognizing that the difference frequency is the same as the frequency at the output of the previous stage, providing the opportunity for cancellation. Thus, in-between the mixer stages the undesired term is removed from the mixer product by a combining circuit 92, which subtracts the previous stage signal having the same frequency as the undesired term, thereby canceling the undesired term. As a result, multiplication by an integer is achieved with a total multiplication factor of n.

Figure 9:
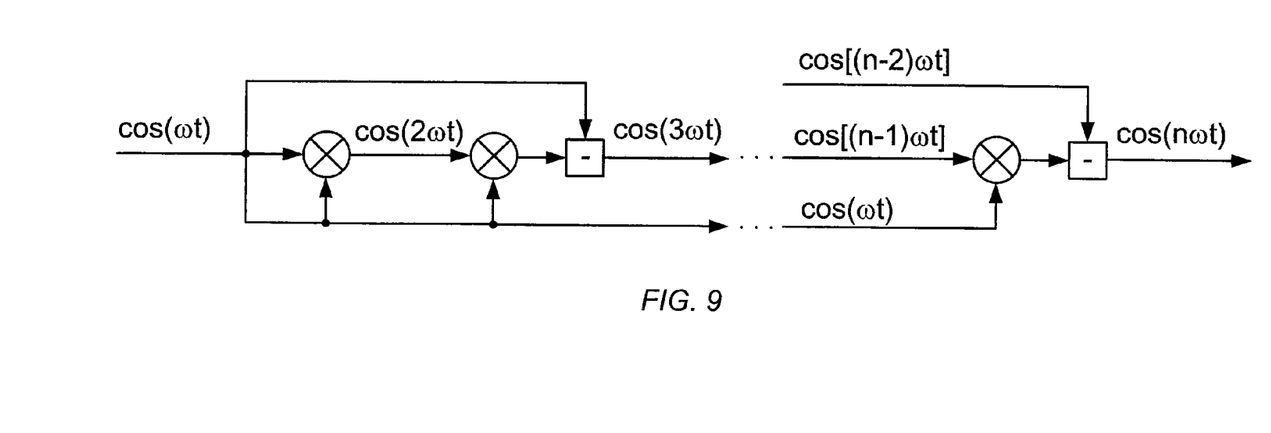
FIG. 9 is an exemplary block diagram representing a subset circuit of the circuit illustrated in FIG. 8 showing only the in-phase arm of the circuit of FIG. 8.

FIG. 9 is a subset circuit of the present invention multiplier circuit of FIG. 8 showing only the in-phase arm of FIG. 8. This is a simplified circuit which can provide for the multiplication of the input signal by an integer number when the quadrature output signal is not needed.

The present invention provides numerous advantages over prior art frequency multiplier circuits. Most importantly, the present invention provides a circuit which provides for low noise frequency multiplication by a large (or small) ratio (i.e., multiplication factor) for use, for example, to generate high-frequency low-jitter clock signals. Importantly, the circuit provides for both low phase noise and low broadband noise.

Another advantage associated with the present invention is that it provides a frequency multiplier method and apparatus which achieves very wide frequency range of operation from low frequencies near DC to very high frequencies close to the transition frequency $f_t$ of the active devices utilized.

Another advantage of the present invention is that it provides a frequency multiplier method and apparatus which simplifies cascading of multiple stages by directly interconnecting the cascaded stages without the need for additional circuitry to achieve higher multiplication ratios.

Yet another advantage of the present invention is that it provides the output quadrature components I and Q of the multiplied signal for use as a source of quadrature signals to be utilized by other component in the system.

Yet another advantage of the present invention is that it provides a frequency multiplier method and apparatus which provides for fast acquisition of the input signal and provides the in-phase and quadrature components of the output multiplied signal with minimal delay, using little or no filtering thus not slowing down the acquisition and multiplication process.

Yet another advantage of the present invention is that it provides a frequency multiplier method and apparatus which achieves low radiated and conducted EMI emissions in order to reduce unwanted signal coupling or ingress into other circuits in densely populated designs, such as in monolithic ICs.

Although certain specific embodiments of the present invention have been disclosed, it is noted that the present invention may be embodied in other forms without departing from the spirit or essential characteristics thereof. Thus, the present embodiments are therefore to be considered in all respects as illustrative and not restrictive, the scope of the invention being indicated by the appended claims, and all changes that come within the meaning and range of equivalency of the claims are therefore intended to be embraced therein.

I claim:

1. A frequency multiplier device comprising:
a plurality of multipliers, each of which has a first input port, a second input port and an output port;
a first combiner coupled to said plurality of multipliers so as to receive an output signal from at least two of said plurality of multipliers, said first combiner outputting a first output signal; and
a second combiner coupled to said plurality of multipliers so as to receive an output signal from at least two of said plurality of multipliers, said second combiner outputting a second output signal;
wherein said plurality of multipliers includes a first multiplier, a second multiplier, a third multiplier and a fourth multiplier, said first multiplier having a first input port and a second input port and receiving a first input signal at said first input port and said second input port; said second multiplier having a first input port and a second input port and receiving a second input signal at said first input port and said second input port; said third multiplier having a first input port and a second input port and receiving said second input signal at said first input port and said first input signal at said second input port; and said fourth multiplier having a first input port and a second input port and receiving said first input signal at said first input port and said second input signal at said second input port.

2. The frequency multiplier device of claim 1, wherein said first combiner receives an output signal from said first multiplier and an output signal from said second multiplier, said first combiner operates to generate a difference signal representing the difference between the output signal of said first multiplier and the output signal of said second multiplier, said difference signal being output by said first combiner as said first output signal.

3. The frequency multiplier device of claim 1, wherein said second combiner receives and output signal from said third multiplier and an output signal from said fourth multiplier, said second combiner operates to sum the output signal from said third multiplier and the output signal from said fourth multiplier, said second combiner outputting the sum of the output signal from said third multiplier and the output signal from said fourth multiplier as said second output signal.

4. The frequency multiplier device of claim 1, wherein said first input signal comprises a cosine portion of a quadrature signal, and said second input signal comprises a sine portion of said quadrature signal.

5. The frequency multiplier device of claim 1, the combination of said first output signal of said first combiner and said second output signal of said second combiner form a quadrature signal having a cosine portion and a sine portion, said first output signal of said first combiner corresponding to cosine portion of said quadrature signal and said second output signal of said second combiner corresponding to said sine portion of said quadrature signal.

6. The frequency multiplier device of claim 1, wherein each of said plurality of multipliers comprises a mixer.

7. A method of performing frequency multiplication comprising the steps of:
  receiving a complex input signal having a cosine portion and a sine portion;
  coupling said complex input signal to a plurality of multipliers, said multipliers including a first multiplier, a second multiplier, a third multiplier and a fourth multiplier, said first multiplier having a first input port and a second input port and receiving said cosine portion of said complex input signal at said first input port and said second input port; said second multiplier having a first input port and a second input port and receiving said sine portion of said complex input signal at said first input port and said second input port; said third multiplier having a first input port and a second input port and receiving said sine portion of said complex input signal at said first input port and said cosine portion of said complex input signal at said second input port; and said fourth multiplier having a first input port and a second input port and receiving said cosine portion of said complex input signal at said first input port and said sine portion of said complex input signal at said second input port;
  coupling an output of said first multiplier and an output of said second multiplier to a first combiner; and
  coupling an output of said third multiplier and an output of said fourth multiplier to a second combiner.

8. The method of performing frequency multiplication of claim 7, wherein said first combiner operates to generate a difference signal representing the difference between the output of said first multiplier and the output of said second multiplier, said difference signal being output by said first combiner as a first output signal.

9. The method of performing frequency multiplication of claim 7, wherein said second combiner receives the output from said third multiplier and the output said fourth multiplier, said second combiner operates to sum the output from said third multiplier and the output from said fourth multiplier, said second combiner outputs the sum of the output from said third multiplier and the output from said fourth multiplier as a second output signal.

10. The method of performing frequency multiplication of claim 7, wherein the combination of said first output signal of said first combiner and said second output signal of said second combiner form a quadrature signal having a cosine portion and a sine portion, said first output signal of said first combiner corresponding to cosine portion of said quadrature signal and said second output signal of said second combiner corresponding to said sine portion of said quadrature signal.

11. A method for performing complex frequency multiplication comprising the steps of:
  receiving a complex input signal;
  generating a complex up-converted signal by mixing said complex input signal with itself; and
  outputting said complex up-converted signal,
  wherein said complex up-converted signal is generated utilizing a plurality of mixers, said mixers including a first mixer, a second mixer, a third mixer and a fourth mixer, said first mixer having a first input port and a second input port and receiving said cosine portion of said complex input signal at said first input port and said second input port; said second mixer having a first input port and a second input port and receiving said sine portion of said complex input signal at said first input port and said second input port; said third mixer having a first input port and a second input port and receiving said sine portion of said complex input signal at said first input port and said cosine portion of said complex input signal at said second input port; and said fourth mixer having a first input port and a second input port and receiving said cosine portion of said complex input signal at said first input port and said sine portion of said complex input signal at said second input port.

12. The method for performing complex frequency multiplication according to claim 11 wherein said complex input signal includes a cosine portion and a sine portion, and said complex up-converted signal includes a cosine portion and a sine portion.

13. A frequency multiplier apparatus comprising:
  a plurality of complex frequency multiplier devices coupled in a cascaded configuration, each of said complex frequency multiplier devices including:
  a plurality of multipliers, each of which has a first input port, a second input port and an output port;
  a first combiner coupled to said plurality of multipliers so as to receive an output signal from at least two of said plurality of multipliers, said first combiner outputting a first output signal; and
  a second combiner coupled to said plurality of multipliers so as to receive an output signal from at least two of said plurality of multipliers, said second combiner outputting a second output signal;
  wherein said plurality of multipliers includes a first multiplier, a second multiplier, a third multiplier and a fourth multiplier, said first multiplier having a first input port and a second input port and receiving a first input signal at said first input port and said second input port; said second multiplier having a first input port and a second input port and receiving a second input signal at said first input port and said second input port; said third multiplier having a first input port and a second input port and receiving said second input signal at said first input port and said first input signal at said second input port; and said fourth multiplier having a first input port and a second input port and receiving said first input signal at said first input port and said second input signal at said second input port.

14. The frequency multiplier apparatus of claim 13, wherein the complex output signal of a given complex frequency multiplier device is coupled to a subsequent complex frequency multiplier device as the complex input signal to both of first input port and the second input port for each of the multipliers of the given complex frequency multiplier device.

15. The frequency multiplier apparatus of claim 13, wherein a complex input signal coupled to a first complex frequency multiplier device of said cascaded configuration of said complex frequency multiplier devices is coupled to the second input port of each of the complex frequency multiplier devices.

16. A complex frequency multiplier device which receives a complex input signal having a first and second portion and generates a complex output signal, said device comprising:
- a first mixer having a first input and second input each of which receives a first portion of said complex input signal; and
- a second mixer having a first input for receiving a first portion of said complex input signal and a second input for receiving said second portion of said complex signal.

17. The complex frequency multiplier device of claim 16, wherein said first portion of said complex input signal is a cosine portion, and said second portion of said input signal is a sine portion.

18. The complex frequency multiplier device of claim 16, further comprising a first amplifier coupled to the output of said first mixer, and a second amplifier coupled to the output of the second mixer.

* * * * *